United States Patent [19]

Brandestini

[11] Patent Number: 5,751,230
[45] Date of Patent: *May 12, 1998

[54] DIGITAL INPUT AND CONTROL DEVICE

[75] Inventor: Marco Brandestini, Montagnola, Switzerland

[73] Assignee: Bourns, Inc., Riverside, Calif.

[*] Notice: The term of this patent shall not extend beyond the expiration date of Pat. No. 5,519,393.

[21] Appl. No.: 788,453

[22] Filed: Jan. 29, 1997

Related U.S. Application Data

[60] Division of Ser. No. 359,703, Dec. 20, 1994, which is a continuation-in-part of Ser. No. 201,739, Feb. 25, 1994, Pat. No. 5,519,393, which is a continuation-in-part of Ser. No. 96,047, Jul. 22, 1993, abandoned.

[51] Int. Cl.$^6$ .................................................. H03M 1/22
[52] U.S. Cl. .................................................. 341/10; 341/16
[58] Field of Search ........................................... 341/10, 16

[56] References Cited

U.S. PATENT DOCUMENTS

| | | |
|---|---|---|
| 3,048,669 | 8/1962 | Mikkola et al. . |
| 3,531,798 | 9/1970 | Bureau . |
| 3,659,083 | 4/1972 | Winter et al. . |
| 3,835,377 | 9/1974 | Kataoka . |
| 4,109,207 | 8/1978 | Petersen . |
| 4,345,240 | 8/1982 | Amano et al. . |
| 4,543,526 | 9/1985 | Burckhardt et al. . |
| 4,806,837 | 2/1989 | Ito . |
| 4,878,013 | 10/1989 | Andermo . |
| 4,901,072 | 2/1990 | Fox . |
| 4,935,739 | 6/1990 | Humphrey . |
| 4,947,166 | 8/1990 | Wingate et al. ............ 341/13 |
| 4,949,087 | 8/1990 | Miyazawa . |
| 5,117,105 | 5/1992 | Nagase et al. . |
| 5,173,693 | 12/1992 | Fry . |
| 5,298,698 | 3/1994 | Iida et al. . |
| 5,315,077 | 5/1994 | Simon et al. . |
| 5,438,193 | 8/1995 | Takagi et al. . |
| 5,519,393 | 5/1996 | Brandestini ................. 341/10 |

FOREIGN PATENT DOCUMENTS

| | | |
|---|---|---|
| 0154654 | 9/1985 | European Pat. Off. . |
| 0332244 | 9/1989 | European Pat. Off. . |
| 0635700 | 1/1995 | European Pat. Off. . |
| 2638918 | 11/1988 | France . |
| 3035774 | 5/1982 | Germany . |
| 2066602 | 12/1979 | United Kingdom . |
| 2202677 | 9/1988 | United Kingdom . |
| 2226720 | 7/1990 | United Kingdom . |

OTHER PUBLICATIONS

Patent Abstracts of Japan; vol. 10, No. 327 (P–513); Nov. 7, 1986—JP–61 133 819 (1 page).
IEEE Transactions of Instrumentation amd Measurement vol. 39, No. 5, Oct. 1990 (pp. 730–734).
Bourns Data Sheet for Digital Contacting Encoders.
EECO Catalog p. 545 showing PCB switches.
Hewlett Packard Catalog pp. 4–4 and 4–5 showing motion sensing and control devices.

(List continued on next page.)

*Primary Examiner*—Marc S. Hoff
*Attorney, Agent, or Firm*—Knobbe, Martens, Olson & Bear, LLP

[57] ABSTRACT

An absolute position encoder converts absolute mechanical position to a digital output value. A single-track, rotary embodiment of the encoder includes several conductive pick-up segments that are symmetrically arranged along a circular pick-up track, with each pick-up segment connected to a respective output terminal. A metallic rotor of the encoder comprises a plurality of contacts that are positioned in alignment with the pick-up track such that the contacts slidably contact different pick-up segments as the rotor is rotated. The contacts on the rotor are conductively interconnected, and are maintained at a common voltage via a sliding connection between the rotor and a collector ring. The output of the encoder is a cyclical Gray code sequence, which may be used in combination with a ROM look-up table to accurately track position. Linear and multi-track embodiments are also disclosed.

27 Claims, 6 Drawing Sheets

OTHER PUBLICATIONS

Gilbert, E.N. "Gray Codes and Paths on the n–Cube", Bell Systems Technical Journal, May, 1958, pp. 815–826.

Ruskey, Frank et al., "Generating Necklaces", J. of Algorithms 13, 1992, pp. 414–430.

Stewart, Ian; "Game, Set & Math", Oxford Press, Cambridge, Massachusetts; 1989; pp. 42–54.

Doeblin, Ernest; "Measurement Systems"; McGraw-Hill Book Company, New York; 1983; pp. 294–299.

Heidenheim Marketing Brochure (except showing Model ROC 411); and attached English Translation.

Vogt Advertisement; and English translation of text.

G.C. Tootill, "The Use of Cyclic–Permuted Chain Codes For Digitisers", Royal Aircraft Establishment, Farnborough, Hants., England.

Ebe Product Announcement; and English translation of text.

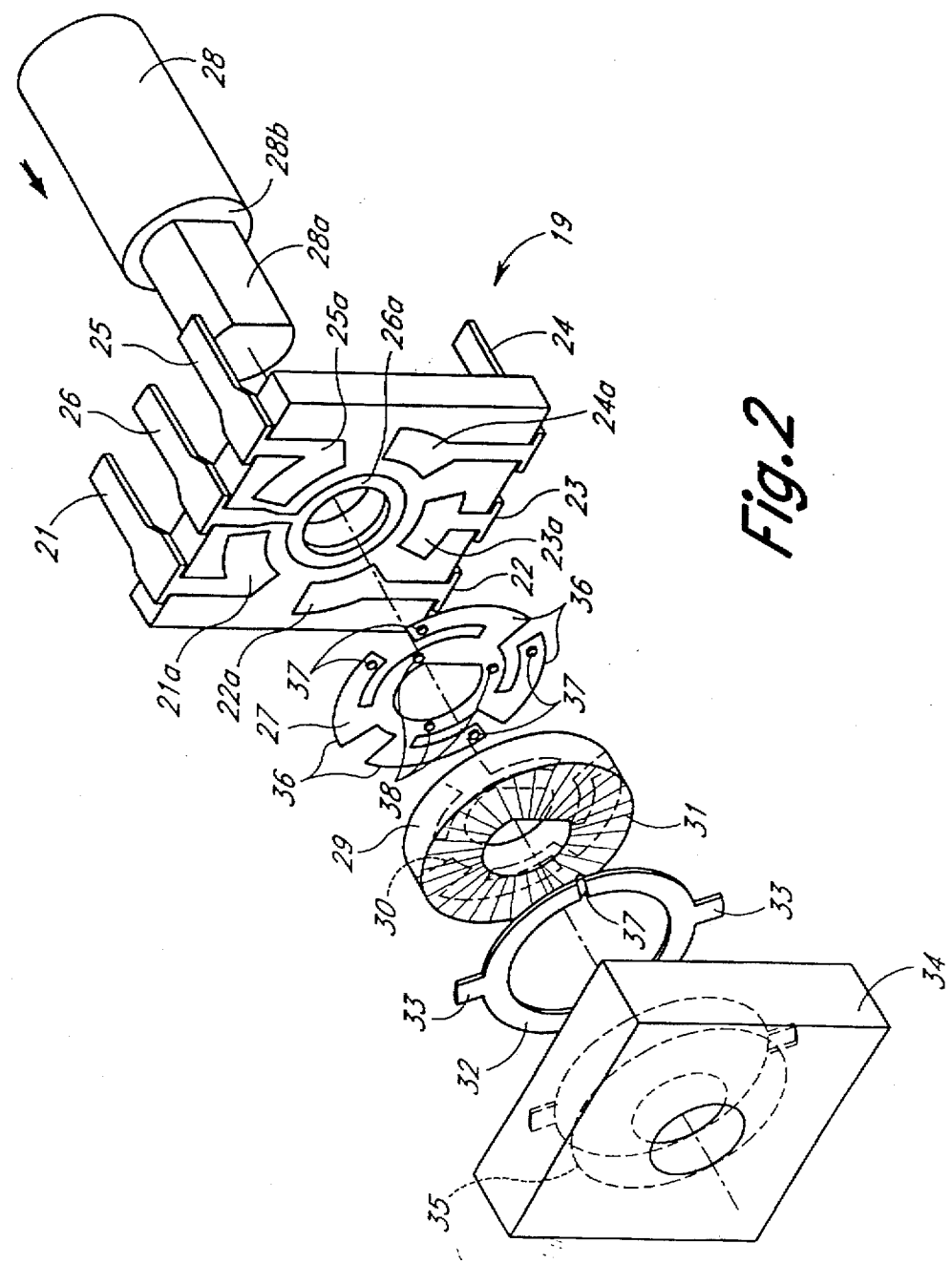

DIGITAL INPUT AND CONTROL DEVICE

This application is a division of U.S. application Ser. No. 08/359,703 filed Dec. 20, 1994, which is a continuation-in-part of U.S. application Ser. No. 08/201,739 filed Feb. 25, 1994 (now U.S. Pat. No. 5,519,393), which is a continuation-in-part of U.S. application No. 08/096,047 filed Jul. 22, 1993 (abandoned).

FIELD OF THE INVENTION

This invention relates to a method and apparatus for directly converting absolute angular or linear mechanical position to a digital output, and more particularly, to an encoder which can be used in place of a resistive potentiometer to input control information.

BACKGROUND OF THE INVENTION

Units of modern electronic equipment commonly contain a large amount of digital circuitry. It is therefore desirable to provide an input device that directly converts the angular position of a knob (or the linear position of a slider) to a digital value. Devices of this type are commonly referred to as "digital position encoders," (or merely "encoders"), although the term "digital potentiometers" is also used. To gain acceptance in the marketplace as a substitute for resistive potentiometers, encoders must be competitively priced.

There is a small selection of digital control devices available in the market. For example, a gray-coded absolute encoder is available as part number EC24BG from Alps Electric of Japan, which has a U.S. office in San Jose, Calif. Also, rotary switches are available from Alcoswitch, CTS, EBE, Nikkai and Omron, among others. All of these elements have a very low resolution (typically only 16 positions). They all are designed traditionally, in that each output bit utilizes a separate parallel track on the coding disc. While these devices have been adequate for their intended purposes, they are bulky, expensive and not ideally suited for use as a general purpose potentiometer.

Copending U.S. application Ser. No. 08/201,739 now U.S. Pat. No. 5,519,393) entitled "Absolute Digital Position Encoder with Multiple Sensors per Track ," owned by the present Applicant, discloses a method and apparatus for converting absolute mechanical position information to a digital output. The method and apparatus disclosed in this copending application represent a substantial improvement over traditional resistive potentiometers, and have been highly satisfactory for their intended purposes. Nevertheless, it would be desirable to provide a functionally equivalent method and apparatus which can be implemented with fewer parts and at lower cost, in order to better compete in the marketplace against conventional potentiometers.

SUMMARY OF THE PREFERRED EMBODIMENTS

The present invention comprises an absolute position encoder that converts the angular position of a knob (or the linear position of a slider element) to a digital output value, with a unique digital code corresponding to each discrete position or setting of the knob (or slider). The sequence of output codes for the encoder is a Gray code sequence, wherein exactly one output bit changes states with each successive position of the knob or slider.

In a preferred, single-track, rotary embodiment, the encoder comprises a stationary member that has multiple equal-length pick-up segments arranged symmetrically along a circular pick-up track, with each pick-up segment connected to a respective output terminal. A metallic rotor of the encoder has point contacts formed on respective metallic wipers. The point contacts are positioned on the rotor in alignment with the circular pick-up track, so that the point contacts come into and out of sliding contact with the various pick-up segments as the rotor is turned. The rotor is maintained at ground level through a sliding connection between the rotor and a grounded collector ring. The rotor thus grounds the various pick-up segments as the rotor is rotated. When a given pick-up segment is not pulled to ground by contact with one of the point contacts, that pick-up segment is pulled high via a respective pull-up resistor. The output is thus a multi-bit binary value. The Gray coded output sequence of the encoder is "built into" the relative angular positions of the point contacts on the rotor.

In comparison with the single-track rotary contact encoder disclosed in the above-referenced copending application, which had separate, electrically insulated wipers mounted to the stator, the present invention permits all of the wipers and point contacts to be provided on a single, stamped metallic rotor. The number of parts is thus reduced, and the manufacturing process is simplified. Further, the rotor no-longer has to include a combination of conductive and non-conductive portions.

In a ternary (three output level) code embodiment of the single-track rotary encoder, a second set of wipers and point contacts is provided on the rotor and positioned in alignment with the pick-up track. This second set of point contacts is electrically isolated from the first set of contacts. Further, the second set of contacts is maintained at a supply voltage of $V_{cc}$, while the contacts of the first set are maintained at ground. As the rotor is rotated, each pick-up segment alternates between $V_{cc}$, an open circuit condition, and ground.

In a linear, two-track embodiment of the invention, an encoder comprises a slider that has multiple point contacts provided on respective wipers. The point contacts are all conductively connected together, and are maintained at ground through a sliding connection between the slider and a ground plane. The point contacts are divided into two groups. The first group of point contacts is aligned along a first linear pick-up track, along which multiple pick-up segments are provided. The second group of point contacts is aligned along a second pick-up track, along which a second set of pick-up segments is provided. The output sequence obtained along the first pick-up track is a modulo-30 sequence, and the output obtained along the second pick-up track is a modulo-25 sequence. The net output is a 300 position Gray code sequence.

BRIEF DESCRIPTION OF THE DRAWINGS

Several preferred embodiments of the invention are described in detail hereinafter with reference to the accompanying drawings, in which:

FIG. 2 is an exploded view of a 30-position encoder corresponding to the embodiment of FIG. 1c and packaged in a six-pin dual-in-line format;

FIG. 4b is a diagrammatic view of sixteen columns or "necklaces" which each represent the smallest binary equivalent for a respective one of the columns in the matrix of FIG. 4a;

DESCRIPTION OF THE PREFERRED EMBODIMENTS

Figures 1A, 1B:
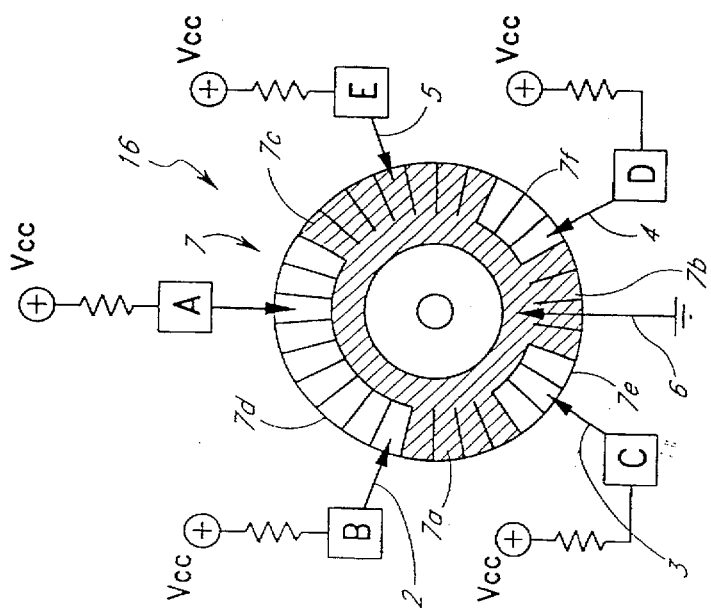
FIG. 1a is a diagrammatic view of a position control device of a type disclosed in the above-cited copending application.
FIG. 1b is a table showing a sequence of output codes.

FIG. 1a diagrammatically depicts an encoder 16 of a type disclosed in copending U.S. application Ser. No. 08/201,739. The present invention relates to an improved device for implementing the same basic function as the encoder 16. Accordingly, the function of the encoder 16 is briefly described in order to facilitate a better understanding of the present invention.

In particular, the encoder 16 is a single-track, thirty-position binary encoder. There are five stationary contact elements 1 through 5, which are fixed on a stationary member (not shown) at equally-spaced angular intervals of 72°. Each contact element 1–5 is formed as a resilient spring element or "wiper" that is conductively connected to a respective output terminal A–E. A rotatably-supported rotor 7 has three angularly-spaced conductive segments 7a, 7b and 7c which are electrically connected to each other, and are electrically connected to ground through a further contact element or wiper 6. Two of the conductive segments 7a and 7b have the same angular length, whereas the third conductive segment 7c has a longer angular length. Non-conductive rotor segments 7d, 7e and 7f are spaced between the conductive segments 7a–7c as shown. The stationary contact elements 1–5 are positioned relative to the rotor 7 such that the contact elements 1–5 are in slidable, mechanical contact with the rotor segments 7a–7f. The contact elements 1–5 may be so positioned, for example, by mounting the contact elements 1–5 to a printed circuit board or other substrate through which the shaft (not shown) of the rotor 7 extends. When one of the contact elements 1–5 is in sliding contact with one of the conductive segments 7a–7c, that contact element is connected to ground. In the operational position shown, only contact element 5 is grounded. When a given contact element 1–5 is not in contact with any one of the conductive segments 7a–7c, it is pulled to the supply voltage $V_{cc}$ via a corresponding pull-up resistor.

The binary sequence produced at the output terminals A–E of the encoder 16 is tabulated in FIG. 1b, and includes thirty distinct output combinations (or "codes") that result as the rotor 7 of FIG. 1a is turned a full turn in the clockwise direction, one step at a time. This sequence exhibits a Hamming distance of "one" between adjacent 5-bit output codes (i.e., only one of the five output bits changes at a time as the rotor 7 is turned), and is thus a Gray code sequence. As recognized by those skilled in the art, Gray code output sequences provide for reliable decoding of output values, since only one output signal line can change states at a time. Using a ROM-based look-up table, the 5-bit output code can be converted into a binary value, the magnitude of which represents the absolute position of the rotor 7 relative to the stationary member.

As is apparent from FIG. 1a, the encoder 16 requires a set of six different contact elements 1–6 which must be separately mounted in electrical isolation from one another, with contact elements 1–5 mounted in accurate angular alignment. Furthermore, the rotor 7 requires a combination of conductive and insulating material. As a result, this design is not as competitive with resistive potentiometers as would be desirable. Accordingly, the improved encoders according to the present invention have been developed, and will now be described.

Figure 1C:
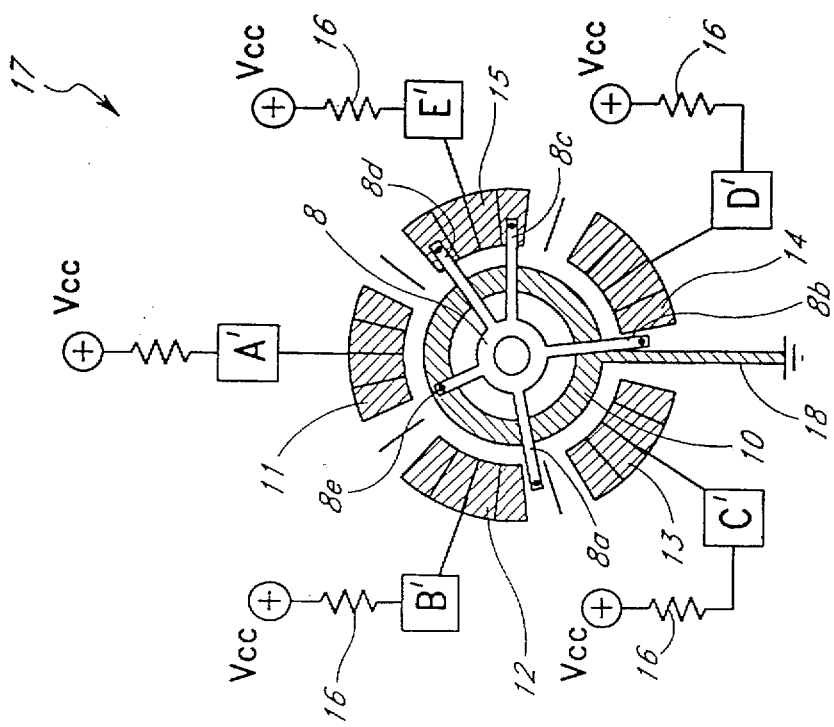
FIG. 1c is a diagrammatic view of a first embodiment of a position control device which embodies the present invention.

FIG. 1c diagrammatically illustrates a first embodiment of an encoder 17 according to the present invention. The rotor 8 is now the contact element or wiper assembly. In particular, the rotor 8 is formed as a single, metallic part with five resilient contact elements or wipers, 8a–8e. Four of the wipers, 8a–8d, have the same length, and have respective point contacts proximate to their ends. The fifth wiper, 8e, has a shorter length, and slides along a stationary collector ring 10 which is connected to ground at 18. Any other conventional means may be used to maintain the rotor 8 at ground. For example, the rotor 8 may be connected to a shaft (as in FIGS. 2 and 4c) that is grounded.

The encoder 17 has five stationary, arc-shaped, conductive pick-up segments 11 to 15, which are conductively connected to respective output terminals A' to E'. The pickup segments 11–15 are provided along a single, circular pickup track that coincides in position with the point contacts of the four longer wipers 8a–8d. Each of the pick-up segments 11–15 has the same length along the pick-up track, with this length corresponding to four consecutive positions or settings of the encoder 17. The collector ring 10 and pick-up segments 11–15 may be provided on a common substrate (as with the stator 19 shown in FIG. 2). The four longer wipers 8a–8d of the rotor 8 are offset from each other by various, predetermined angular intervals. Each of these four wipers 8a–8d moves into and out of sliding contact with successive pick-up segments 11–15 as the rotor 8 rotates. When a given pick-up segment 11–15 is not in contact with one of the wipers 8a–8d, the corresponding terminal A'–E' is pulled high (i.e., to Vcc) via the respective pull-up resistor 16.

The encoder 17 is functionally equivalent to the encoder 16 in FIG. 1a, in that turning the rotor 8 will produce the same Gray code sequence (FIG. 1b) at the output terminals A' to E'. However, the Gray coded output sequence is now "built into" the relative angular positions of the wipers 8a–8d. A significant advantage of the encoder 17 is that the new arrangement can be manufactured very efficiently. For example, since the wipers 8a–8e are now conductively connected to one another, the encoder 17 can be manufactured without having to accurately mount separate and electrically-isolated wipers on the printed circuit board or other substrate. Further, since the rotor 8 does not include non-conductive portions, it can be inexpensively manufactured as a stamped, metallic part.

It should be noted that the encoders 16 and 17 described above (and encoders 50, 60 and 70 described below) are "absolute" position encoders, since the current digital output represents the present absolute position of the knob (or slider) regardless of past activity. This is in contrast to "incremental" position encoders, which keep track of each incremental change in position in order to determine the present position. Advantageously over incremental encoders, absolute encoders can detect absolute position upon power-up, without being mechanically "zeroed." Further, the output of an absolute encoder can typically be sampled at a lower rate, since undetected transitions between positions do not affect the validity of the output.

FIG. 2 is a perspective exploded view of one preferred implementation of the encoder 17 of FIG. 1c. A stator 19 is configured as a dual-in-line package with six terminals 21 to 26. The terminals 21–25 correspond to the output terminals A'–E' of FIG. 1c, and the terminal 26 corresponds to the ground connection 18. The terminals 21–25 are conductively connected to respective arc-shaped pick-up segments 21a–25a. The terminal 26 is conductively connected to a collector ring 26a. Each terminal 21–25 and respective pick-up segment 21a–25a are formed as a single, metallic piece that is mounted to and partially housed within a substrate portion 20 of the stator 19. The terminal 26 and collector ring 26a may be formed in a similar manner.

Alternatively, the pick-up segments 21a–25a and the collector ring 26a may be formed as lanes on the substrate 20, and then conductively connected to the respective terminals 21–26 by solder. The pull-up resistors 16 (FIG. 1c) connected to the output terminals A'–E' are separate from and external to the dual-in-line package, and are therefore not shown in FIG. 2.

A metallic rotor 27 (corresponding to the rotor 8 of FIG. 1c) and a detent element 29 are rotated by a shaft 28. The shaft 28 has a flat 28a on one side that cooperates with non-circular openings in the rotor 27 and the detent element 29 in order to prevent relative rotation of these parts. The rotor 27 comprises four wipers 36, each wiper having a point contact 37 at its end. The point contacts 36 are aligned with a single circular track that coincides with the positions of the pick-up segments 21a–25a. The point contacts 37 protrude axially in the direction of the stator 19, and contact the pick-up segments 21a–25a as the shaft 28 is rotated. The rotor 27 also has ground contacts 38 (shown as point contacts in FIG. 2) for contacting the collector ring 26a. The use of resilient, spring-like wipers 36 assists in maintaining continuous contact between the point contacts 36 and the stator 19. However, the use of wipers is not essential, and other conventional means for urging the point contacts 37 against the stator 19 may be employed. To increase the reliability and durability of the rotor 27, one or more additional, "redundant" point contacts may be provided for each point contact 37 shown in FIG. 2 (with each redundant point contact positioned on along the same radial line as the corresponding point contact 37).

The rotor 27 interlocks with a feature 30 (shown in dashed lines) provided on the side of the decent element 29 that faces the rotor 27. On the side opposite from the rotor 27, the detent element 29 has a cicumferential band of thirty radially extending serrations 31. Detent action is achieved by an annular spring 32 which has a bent detent portion 37 that is resiliently urged by the spring 32 into slidable engagement with the band of serrations 31, in order to define thirty preferred angular positions of the detent element 29, rotor 27, and shaft 28. The resilient force exerted by the spring 32 on the detent element 29 is passed on to the rotor 27 in order to urge the rotor 27 against the stator 19.

A lid 34 closes the device. The lid 34 has on the side facing the stator 19 a cylindrical opening 35 (shown in dashed lines) which accommodates the various rotating elements. Two recesses project radially outward from diametrically opposite sides of the cylindrical opening 35, and receive respective tabs 33 provided on the annular spring 32 in order to secure the spring 32. A conventional stop part could be added to restrict the rotation of the shaft 28 and associated parts to a range of less than 360°. Advantageously, the single track encoder according to the present invention can be housed in a sub-miniature package with a large center hole, while yielding satisfactory resolution. The ability to manufacture the encoder 17 in a small package is due in-part to the fact that only one track is employed, unlike many prior art encoders which employ multiple concentric tracks. A reduction in size is also made possible by the movement of the wipers to the rotor.

Figure 3:
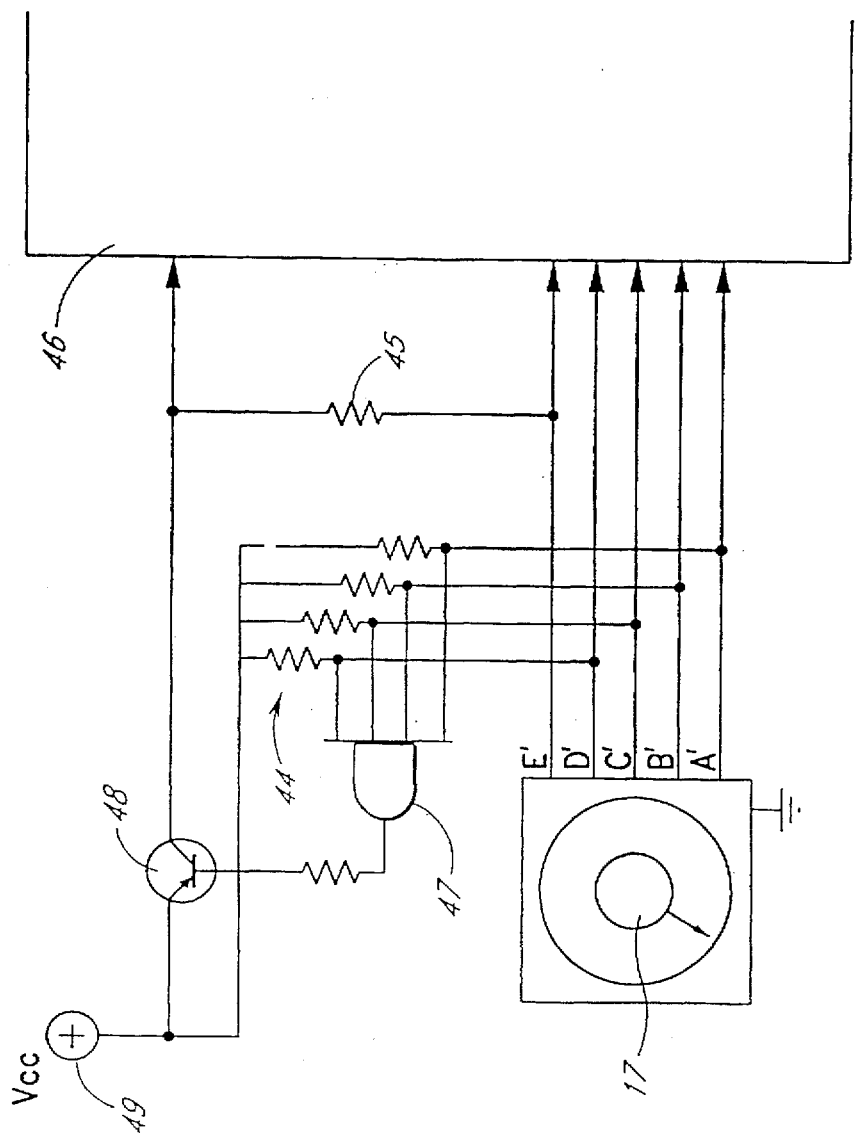
FIG. 3 is a schematic diagram of a circuit which includes the encoder of FIG. 1c and which implements a power on/off function.

In many applications it is desirable to turn off the power to associated circuitry when the encoder shaft is in the zero position. This is the case, for example, when the encoder is used as a volume control knob for a radio. The encoder 17 can be used to perform such an ON/OFF function (in addition to serving as a general purpose control device) without the need for a dedicated switch structure. Referring to FIG. 1b, the chosen "zero" position for the encoder 17 corresponds to the code word "01111." A mechanical stop can establish this zero position as the fully counterclockwise or "OFF" position. A decode circuit can then be used to turn off power to the subject electronics when this output value is present. FIG. 3 shows a circuit that performs such a function. The circuit includes a 4-input AND gate 47 having its respective inputs connected to output terminals A', B', C' and D' of the encoder 17. The output of the AND gate 47 is connected to the base of a PNP switching transistor 48, which serves as a switch through which current passes from a DC power source 49 to radio electronics 46. The DC power source 49 is also connected to the outputs A'–D' of the encoder 17 via respective pull-up resistors 44. The output E' of the encoder 17 is connected to the collector of the transistor 45 via a pull-up resistor 45. When the output of the encoder 17 on the lines A'–D' is any value other than "1111," the output of the AND gate 47 is low, maintaining the transistor 48 in an ON state and allowing current to flow to the radio electronics 46. Thus, when the encoder shaft is in one of the twenty-nine discrete positions other than the zero position, power is provided to the radio electronics 46. These non-zero positions may be used, for example, to define twenty-nine discrete volume settings for the radio. When the output of the encoder 17 on the lines A'–D' is "1111," (when the encoder shaft is in the zero position), the transistor 48 turns off, effectively disconnecting the electronics 46 from the power source 49.

An optional feature of the encoder 17 will now be describe. Referring to FIG. 1b, it is noted that the code "11111" does not appear in the output sequence. In order to generate this unique output code, the shaft 28 is pushed in the direction of the arrow in FIG. 2, causing the flat portion 28b of the shaft 29 to contact and push against the rotor 27 (against an opposing force generated by the spring 32) until the rotor 27 disengages with the grounded collector ring 26a. When the rotor 27 separates from the collector ring 26a, the pull-up resistors (FIG. 1c) pull the output terminals 21–25 high, producing the code value "11111". Since this code value is unique, it can be assigned to a special function. For example, a five-input AND gate can be used to detect this code, and to generate a "SEND" or "ENTER" command. Upon release of the shaft 28, the spring 32 returns the rotor 27 to its original axial position, and the angular-position-based output code is reinstated.

The Gray coded output sequence of the encoder 17 is built into the relative angular positions of the wipers 8a–8d (FIG. 1c), and into the arrangement of the pick-up segments 11–15 along the pick-up track. For the encoder 17 shown in FIGS. 1c and 2, the pick-up segments are symmetrically spaced around the pick-up track, with each segment 11–15 having a length corresponding to four discrete encoder positions. This symmetric arrangement of pick-up segments produces a cyclical output, wherein the sequence of states seen at one output terminal during one cycle repeats on the next output terminal during the next cycle. This characteristic of the output sequence is best seen in FIG. 1b, in which reference characters 40 and 41 denote separate six-position cycles of the encoder 17. Note in FIG. 1b that each block of five output codes (such as the block 41) is identical to the previous block, except that the rows are rotated downward by one position. For example, the rows "000011", "111000", "110000", "100001" and "111111" respectively correspond to contacts E, D, C, B and A at 40, and respectively correspond to contacts D, C, B, A and E at 41, and so forth. Thus, the output sequence repeats itself after every six positions, but with the output terminals A–E rotated by one position. It is also noted that the output code "01111" at position 0 and the output code "00111" at position 29 differ in only one digit. The output is thus a cyclic Gray code sequence.

The mathematical characteristics of encoders in accordance with the present invention will now be described.

Figure 4A:
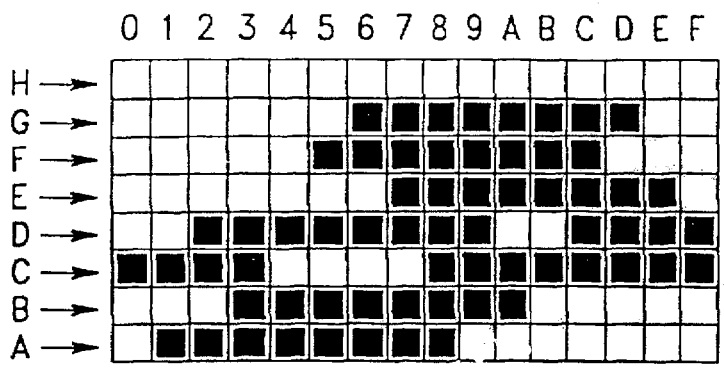
FIG. 4a is a diagrammatic view of a matrix representing the states detected by a set of stationary pick-up segments in a 128-position encoder according to a second embodiment of the present invention.

FIG. 4a represents the output code sequence for sixteen consecutive positions 0-F (or one cycle) of an encoder which is similar to the encoder 17 of FIGS. 1c and 2, but which has 128 angular positions and produces an 8-bit binary output on contacts A–H. The sequence is tabulated as 8 rows or 16 cells, with black cells representing contacts to ground. The rows represent the states that each of eight contacts A through H sees when stepping through 16 of the 128 angular positions or increments. The sequence of 16 output codes illustrated in FIG. 4a will repeat itself with each successive cycle (for a total of eight cycles), with the output terminals A to H rotated upward by one place with each successive cycle. Thus, the entire sequence of 128 8-bit output codes is fully specified by the code sequence shown in FIG. 4a.

Figure 4B:
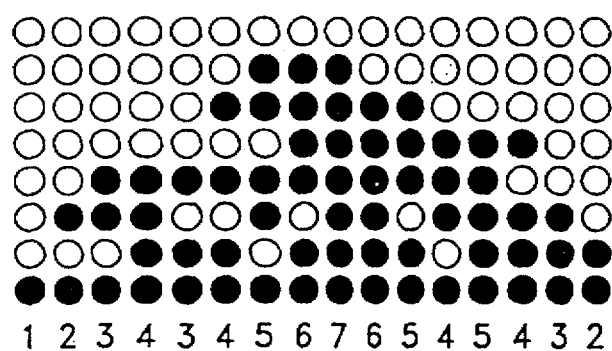

Turning now to the properties of the code sequence of FIG. 4a, it is first necessary to verify that all 128 code bytes are different. This is done by resorting to a mathematical concept known as the necklace. A necklace represents one candidate of all the elements (in this case 8-bit codes) which are cyclic permutations of each other. A good description and an algorithm to generate the necklaces is found in: Frank Ruskey, "Generating Necklaces", Journal of Algorithms, Vol.13, pp. 414–430, 1992. Since the present arrangement will rotate through all of the cyclic permutations, it is important to be sure the present code is made from sixteen different necklaces. FIG. 4b shows the necklaces and the number of black beads, each necklace being represented as the smallest binary equivalent for the respective column (where black=0).

As with the output sequence shown in FIG. 1b, it can be verified that the 128-code sequence represented by FIG. 4a is a Gray code sequence, as exactly one output bit differs between adjacent code words (including code words 127 and 0).

Figure 4C:
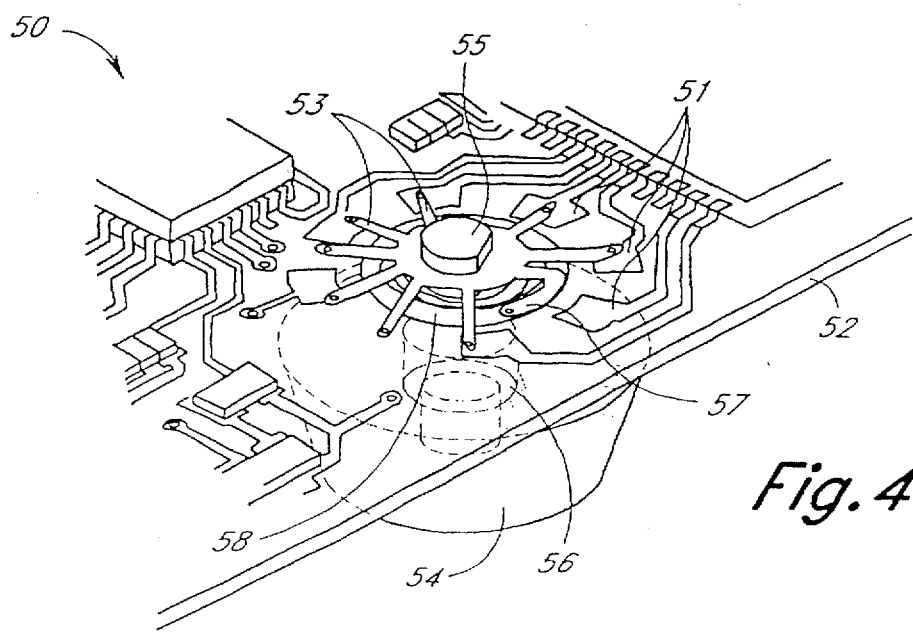
FIG. 4c is a perspective view of a 128-position device which corresponds to the matrix of FIG. 4a and which is embedded in a printed circuit board.

FIG. 4c shows an encoder 50 which is a physical implementation of the code table of FIG. 4a. The conductive pick-up segments 51 in this case are provided directly on a circuit board 52, and are arranged completely symmetrically around the single pick-up track. Each pick-up segment has a length that corresponds to eight rotor positions, since the horizontal bands of black cells in FIG. 4a are each eight cells wide (as further described below) The angular information comes about by means of the relative angular locations of the respective point contacts on the wipers 53. The relative angular locations of the point contacts correspond to the relative positions of the eight white-to-black transitions in FIG. 4a. The knob 54 and shaft 55 are supported on the circuit board 52 by a bushing 56. Ground is picked up from the ring 58 by the wiper 57.

Referring to FIG. 4a, it should be noted that there are eight horizontal bands of black cells that are each eight cells wide, with one of the bands "split" between row E (columns C–F) and row D (columns 0–3). Note that when the next 16-position sequence is generated (by rotating the rows A–H upward by one position), the half-width band now appearing at the beginning of row D will line up with the half-width band at the end of row E. Further note that the half-width band that will appear at the end of the 16-position sequence for the last cycle (which may be obtained by rotating the rows A–H upward by seven positions) will line up with the half-length band at row D. Thus, the entire 128 position sequence comprises equal length bands of black cells that are separated by varying numbers of white cells. Since all of the bands of black cells are of equal length, a total of eight point contacts (corresponding to the number of equal-length bands in FIG. 4a) must be provided along the pick-up track (as shown in FIG. 4c). If one or more bands of black cells had a different length, a greater number of point contacts would be required on the rotor. Thus, the solution illustrated by FIGS. 4a–4c is an "optimal" solution, in that the number of wipers on the rotor is minimized.

The 30-position encoder 17 of FIG. 1c is an example of a non-optimum solution. Note in FIG. 1b that the output sequence features two bands of 4 black cells (i.e., bands of zeros) and one band of 7 cells, with the 7-cell band corresponding to two 4-cell bands that overlap by one position. Since all bands do not have the same length, the minimum number of three wipers must be exceeded.

Specifically, a fourth wiper (8c or 8d) must be provided in order to obtain sequences of seven consecutive zeros. Note in FIG. 1c that since the wipers 8c and 8d are disposed three cells apart, a given pick-up segment will be grounded for seven consecutive positions as the wipers 8c and 8d pass over that segment. Incidentally, the four wipers 8a–8d of FIG. 1c are still less than the five wipers 1–5 utilized by the encoder 16 of FIG. 1a.

As will be apparent from the foregoing, a suitable output sequence (such as the sequences of FIGS. 1c and 4a) must be generated in order to design an encoder of the type shown in FIGS. 1c and 4c. Such an output sequence will preferably be a cyclic Gray code sequence having a unique code for each encoder position. Further, where possible, all bands of zeros in the sequence should be of equal length. The applicant is not presently aware of a technique for mathematically generating a code sequence with these desired properties. Thus, suitable sequences must presently be generated solely by combinatorial trial and error.

There is one minor drawback to "optimized" encoders according to the present invention in comparison with encoders of the type shown in FIG. 1a. In particular, the 30 maximum number of positions for a given number of output bits is less for encoders of the type shown in FIG. 4c than for the approach illustrated by FIG. 1a. For example, for an encoder having an 8-bit output, a maximum of 240 steps is possible when the wipers are on the stator (as in FIG. 1a) whereas a maximum of only 144 steps is possible when the wipers are on the rotor according to the present invention. The choice of solutions widens, however, if one is willing to use more than the minimum possible number of wipers (as in FIG. 1c), or equivalently, to provide at least one band of contiguous "black" cells which is wider than the others.

For the novel encoders of the type described above, the total number of increments for a full 360° revolution must be a multiple of the number of output bits. Thus, for example, the encoder 17 has 30 positions (a multiple of five), and the encoder shown in FIG. 4c has 128 positions (a multiple of 8). This condition restricts the selection of possible code-lengths For many applications, such as volume control, the number of positions or increments is not critical. In other cases, it might be desirable to divide 360° into a specific number of steps; a decimal or a power of two being preferred choices.

Figure 5:
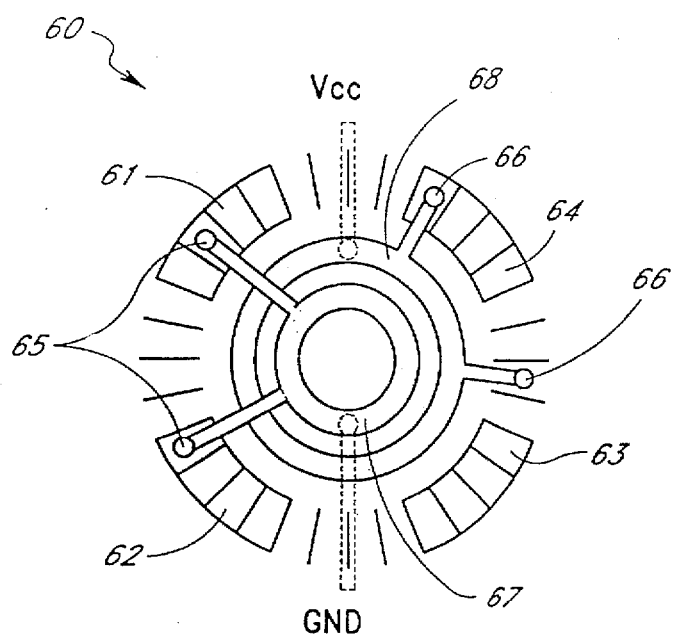
FIG. 5 is a diagrammatic view of a 32-position encoder which is based on a ternary code, and which represents a third embodiment of the present invention.

FIG. 5 illustrates a 32 position encoder 60 based on a ternary code (i.e., a code wherein each digit can take on one of three states). Again, there are four identical segments 61 to 64 located on the stator (stator not shown). Four wipers 65 and 66 are provided on the rotor in a manner similar to the binary case (FIG. 1c), except that in FIG. 5 the wipers 65 and 66 are connected to two conductive rings 67 and 68 respectively. The rings 67 and 68 are connected to ground and to the supply voltage $V_{cc}$, respectively, and are fixed to one another (in electric isolation) so that all of the wipers rotate in unison. The voltage levels of ground and $V_{cc}$ define two of the three states for each output line. The third state is the "open" state, which exists for a given pick-up segment 61–64 when none of the four wipers 65, 66 are in contact with that segment. Ternary solutions allow different sequence lengths and require fewer output lines.

Figure 6:
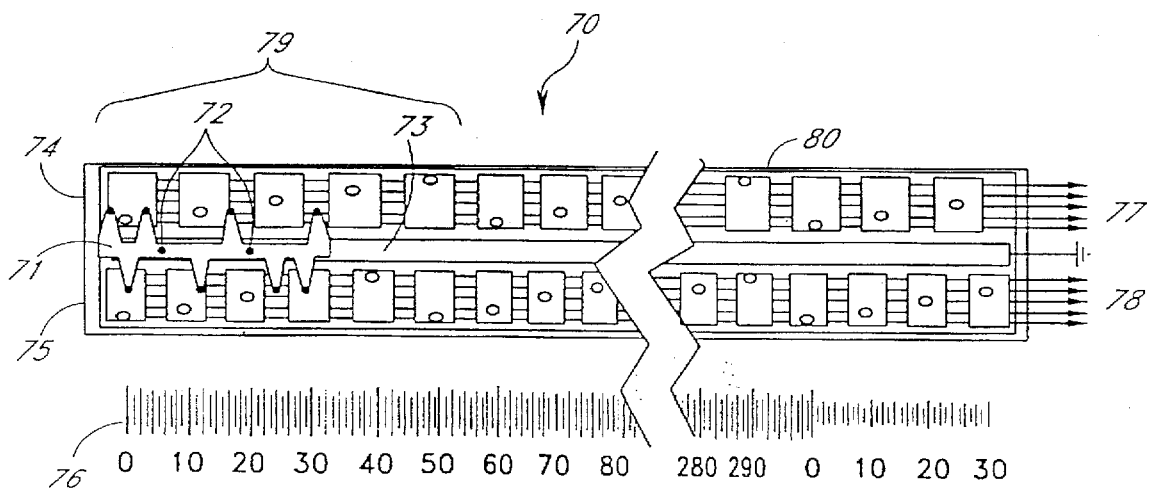
FIG. 6 is a diagrammatic illustration of a linear encoder which features two parallel code sequence arrangements, and which represents a fourth embodiment of the present invention.

Another application of the inventive principle is in linear fader elements. Using the prior art techniques, it is not possible to realize a compact fader without the need for flexible connectors. FIG. 6 shows a 300 position linear encoder 70 which has a travel distance of 120 mm and a total length of 140 mm, and which is thus comparable in size to a conventional resistive fader. A metallic wiper assembly 71 (or "slider") slidably engages a "common" or ground bus 73 through contacts 72, which serves to maintain the entire wiper assembly 71 at ground. The linear encoder has two sides, 74 and 75, the side 74 featuring a length "30" sequence, and the side 75 featuring a length "25" sequence. The eight wipers on the wiper assembly 72 are divided into two groups of four, one group corresponding to the side 74, and the other group corresponding to the side 75. There are periodic groups of five rectangular pick-up segments (referred to herein as "contact plates") on either side. One such group is shown by reference number 79. Five bus lines 77, 78 are provided on each side 74, 75 respectively, with each line being connected to every fifth contact plate. The contact plate 80, for example, is connected to the uppermost bus line shown in FIG. 6. The bus lines 77 and 78 are connected to output terminals (not shown) of the encoder 70.

The distribution of contact plates on the modulo 30 side 74 is the now familiar one—a contact plate four increments wide and then a gap of two increments (comparable to the length and spacing of the pick- up segments 11–15 in FIG. 1c). For the modulo 25 side 75, each contact plate is three increments wide, and the gap between adjacent contact plates is two segments wide. The smallest common multiple of "125" and "30" is "150". This number can be doubled by offsetting the two tracks (or the wipers on either side) by one increment:. The scale 76 shows the division thus obtained (from 0 to 299), at which point the pattern repeats.

The arrangement in FIG. 6 is similar to the classical analog "vernier" used in various units of measuring equipment. The novelty lies in-part in the fact that this is a digital vernier, wherein the step size is the same on both sides 74, 75 and the sequence length differs. A ROM look-up table can be used to convert the ten-line output to straight binary data. As will be recognized from the foregoing, the two track approach of this linear encoder 70 could also be implemented in a rotary device.

Although several preferred embodiments have been shown and described in detail for illustrative purposes, it will be recognized that there are variations and modifications of these preferred embodiments, including various rearrangement of parts, which lie within the scope of the present invention. Thus, the scope of the present invention should be defined only in accordance with the following claims and their equivalents.

What is claimed is:

1. A single-track absolute digital position encoder, comprising:

a first member having a plurality of conductive pick-up segments positioned along a pick-up track, said pick-up segments electrically insulated from one another, each pick-up segment corresponding to a respective digit of an output code of the encoder;

a second member supported for relative rotational movement with respect to said first member over an operable range which exceeds 90°; and a plurality of contacts aligned with said pick-up track such that said contacts move into and out of mechanical contact with said pick-up segments to thereby modify said digits of said output code when said first and second members are moved relative to one another;

wherein no more than one digit of said output code changes at-a-time when said second member is rotated relative to said first member over said range, and wherein each value of said output code generated over said range uniquely corresponds to a respective relative position of said first and second members.

2. The single-track absolute digital position encoder according to claim 1, wherein said second member is rotatable continuously relative to said first member, and wherein said output code follows a Gray code sequence through multiple revolutions of said second member relative to said first member.

3. The single-track absolute digital position encoder according to claim 2, wherein said Gray code sequence is a cyclic Gray code sequence.

4. The single-track absolute digital position encoder according to claim 1, wherein said contacts are electrically connected together such that all of said contacts are maintained at a common voltage, and wherein each of said digits is a binary digit.

5. The single-track absolute digital position encoder according to claim 1, wherein each of said digits is a ternary digit.

6. The single-track absolute digital position encoder according to claim 1, wherein said first member comprises a printed circuit board, and wherein said pick-up segments comprise pads on said printed circuit board.

7. The single-track absolute digital position encoder according to claim 6, wherein said second member comprises a metallic rotor, and wherein said contacts are provided on said rotor such that said contacts move into and out of sliding contact with said pads when said second member is rotated relative to said first member.

8. The single-track absolute digital position encoder according to claim 1, wherein each of said pick-up segments is contiguous along said pick-up track.

9. The single-track absolute digital position encoder according to claim 1, wherein each of said contacts moves into and out of contact with each of said pick-up segments when said second member is moved relative to said first member over said range.

10. A single-track absolute digital position encoder, comprising:

a first member having a plurality of conductive pick-up segments positioned along a common pick-up track, each of said pick-up segments being contiguous along said pick-up track and corresponding to a respective digit of an output code of the encoder; and a second member movably mounted with respect to said first member, said second member comprising a plurality of contacts, each contact positioned on said second member in alignment with said pick-up track such that said contacts move into and out of sliding contact with said pick-up segments when said second member is moved relative to said first member;

wherein said pick-up segments and said contacts are arranged such that only one of said contacts moves into or out of contact with any one of said pick-up segments at-a-time when said second member is moved relative to said first member, and such that each value of said output code uniquely represents a respective relative position of said first and second members.

11. The single-track absolute digital position encoder according to claim 10, wherein said contacts are conductively connected together such that all of said contacts have the same voltage.

12. The single-track absolute digital position encoder according to claim 10, wherein a first subset of said contacts are maintained at a first voltage and a second subset of said contacts are maintained at a second voltage.

13. The single-track absolute digital position encoder according to claim 10, wherein said pick-up track is circular.

14. The single-track absolute digital position encoder according to claim 10, wherein said second member is continuously rotatable relative to said first member, and wherein a sequence of values of said output code generated when said second member is rotated over a range of 360° relative to said first member is a continuous Gray code sequence.

15. The single-track absolute digital position encoder according to claim 14, wherein said continuous Gray code sequence is a cyclic Gray code sequence.

16. An absolute digital position encoder, comprising:

a first member having a plurality of sensors, said plurality of sensors comprising a plurality of conductive pick-up segments positioned along a common pick-up track, each of said sensors corresponding to a respective digit of an output code of the encoder;

a second member movably mounted with respect to said first member; and a plurality of sensor-detectable elements positioned in alignment with said pick-up track so as to interact with said sensors and thereby modify said digits when said first and second members are moved relative to one another, said sensor-detectable elements comprising conductive contacts which move into and out of contact with said pick-up segments of said first member;

wherein a sequence of values of said output code generated when said first member is moved relative to said second member is a Gray code sequence.

17. The single-track absolute digital position encoder according to claim 16, wherein said conductive pick-up segments are electrically insulated from one another, and each of said pick-up segments is formed as a contiguous contact segment along said pick-up track.

18. The single-track absolute digital position encoder according to claim 16, wherein said conductive contacts slide into and out of contact with said pick-up segments.

19. The single-track absolute digital position encoder according to claim 16, wherein said pick-up track is circular.

20. The single-track absolute digital position encoder according to claim 16, wherein the number of said sensors is 5, and the number of unique code values in said cyclic Gray code sequence is 30.

21. The single-track absolute digital position encoder according to claim 16, wherein the number of said sensors is 8, and the number of unique code values in said Gray code sequence is 128.

22. An absolute digital position encoder, comprising:

a first member which generates an output code, said output code comprising a plurality of digits, said first member comprising a plurality of conductive pick-up members, each of said pick-up members corresponding to a respective digit of the output code and forming a contiguous contact segment along a pick-up track;

a second member movably mounted with respect to said first member; and a plurality of contacting members which move into and out of contact with said pick-up members to modify said digits in response to relative movement of the first and second members, wherein a sequence of values of said output code generated when said first and second members are moved relative to one another is a cyclic Gray code sequence, and each value of said sequence uniquely corresponds to a respective relative position of said first and second members.

23. The absolute digital position encoder according to claim 22, wherein said second member is rotatably mounted with respect to said first member.

24. The absolute digital position encoder according to claim 22, wherein said first member comprises a plurality of sensors which generate said plurality of digits, each of said sensors comprising a respective one of said pick-up members.

25. The absolute digital position encoder according to claim 24, wherein the number of said sensors is 5, and the number of unique code values in said cyclic Gray code sequence is 30.

26. The absolute digital position encoder according to claim 24, wherein the number of said sensors is 8, and the number of unique code values in said cyclic Gray code sequence is 128.

27. The absolute digital position encoder according to claim 22, wherein the number of unique code values in said cyclic Gray code sequence is at least 30.

* * * * *

UNITED STATES PATENT AND TRADEMARK OFFICE
CERTIFICATE OF CORRECTION

PATENT NO. : 5751230
DATED : May 12, 1998
INVENTOR(S) : Marco Brandestini

It is certified that error appears in the above-identified patent and that said Letters Patent is hereby corrected as shown below:

Column 1/Line 41 replace "739 now U.S. Patent No. 5,519,393) entitled" with -- 793 entitled--.

Column 1/Line 42 replace "Encoder with Multiple Senors per Track," owned" with --Encoder," owned --.

Column 6/Line 52 replace "describe." with -- described.--.

Column 8/Line 63 replace " the 30 maximum" with -- the maximum --.

Column 9/Line 64 replace " "125" " with -- "25" --.

Column 9/Line 66 replace "increment:." with -- increment. --.

Signed and Sealed this

Twenty-fourth Day of August, 1999

Attest:

Q. TODD DICKINSON

Attesting Officer     Acting Commissioner of Patents and Trademarks